United States Patent [19]

Warren, deceased

[11] 4,034,290

[45] July 5, 1977

[54] ELECTRICAL METER ASSEMBLY HAVING DISPLACED METER AND SOCKET TERMINALS

[75] Inventor: Robert A. Warren, deceased, late of Raleigh, N.C., by Dorothy L. Warren, executrix

[73] Assignee: Westinghouse Electric Corporation, Pittsburgh, Pa.

[22] Filed: Jan. 28, 1976

[21] Appl. No.: 653,046

[52] U.S. Cl. .............................. 324/110; 324/149; 324/156; 339/36; 361/372

[51] Int. Cl.² ................. G01R 11/24; G01R 1/04; H01R 13/64

[58] Field of Search ................. 324/110, 149, 156; 339/36, 37, 186 M, 185 R; 317/105, 107, 108, 111

[56] References Cited

UNITED STATES PATENTS

| | | | |
|---|---|---|---|
| 2,643,362 | 6/1953 | Johansson | 339/36 |
| 3,519,976 | 7/1970 | Orr | 339/36 |
| 3,742,355 | 6/1973 | Darling | 324/149 |
| 3,904,935 | 9/1975 | Brewer et al. | 324/149 X |

*Primary Examiner*—Gerard R. Strecker
*Attorney, Agent, or Firm*—R. W. Smith

[57] ABSTRACT

An electrical meter assembly including a plug-in meter and a meter socket, each having terminals. An adaptor modifies a terminal of the meter socket, enabling the modified and unmodified terminals thereof to engage the terminals of the meter in only one orientation of the meter relative to the meter socket.

6 Claims, 8 Drawing Figures

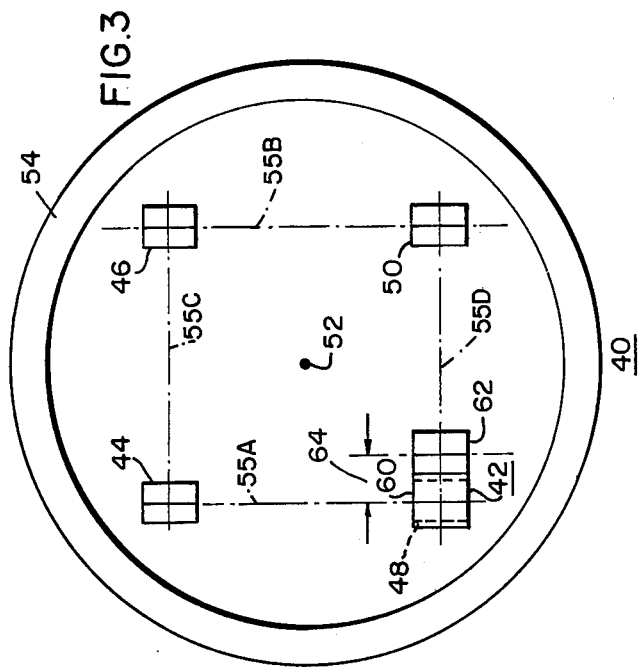
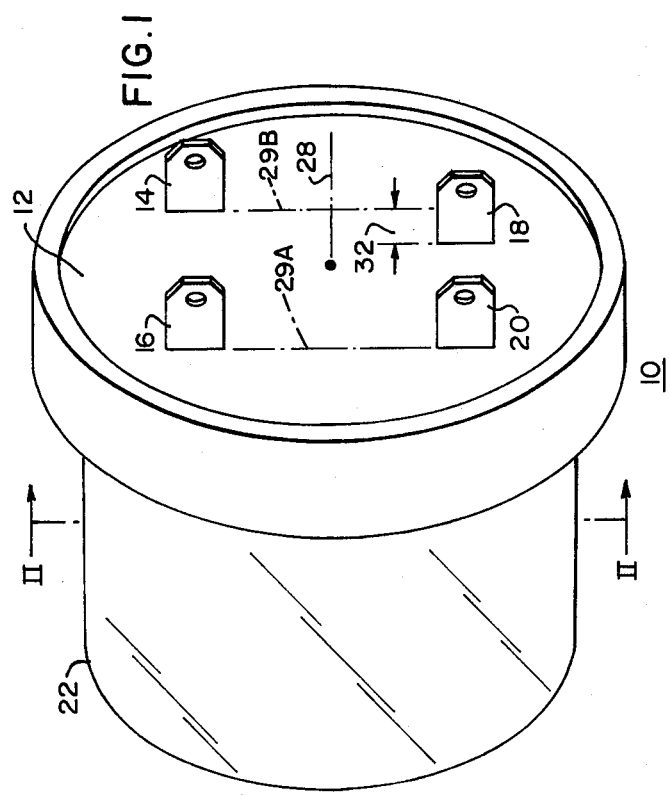
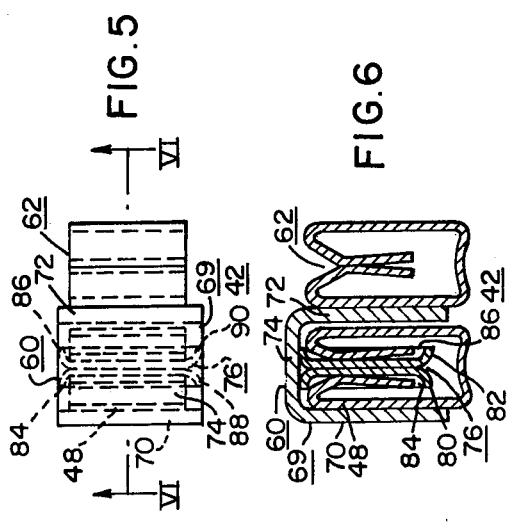
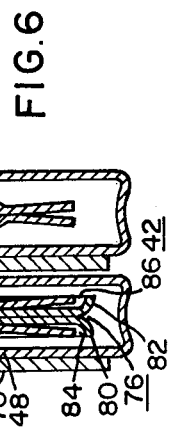

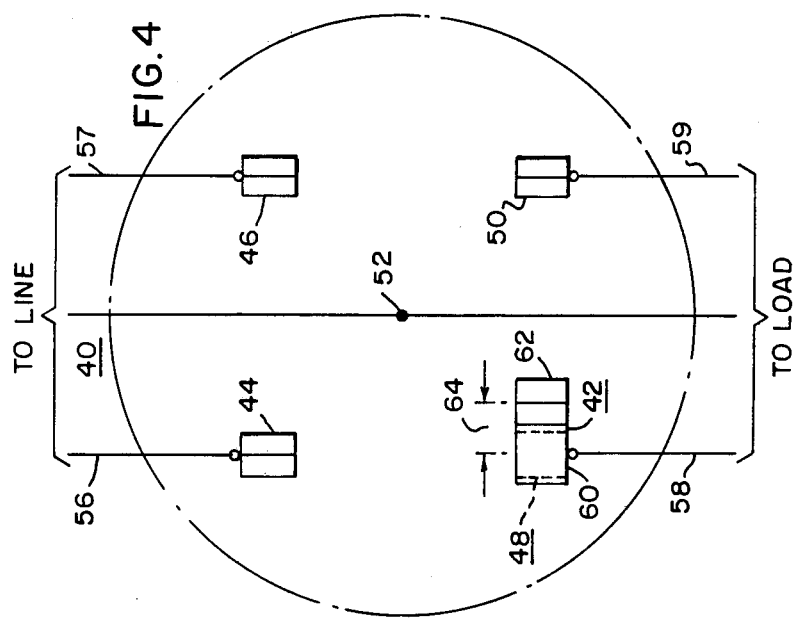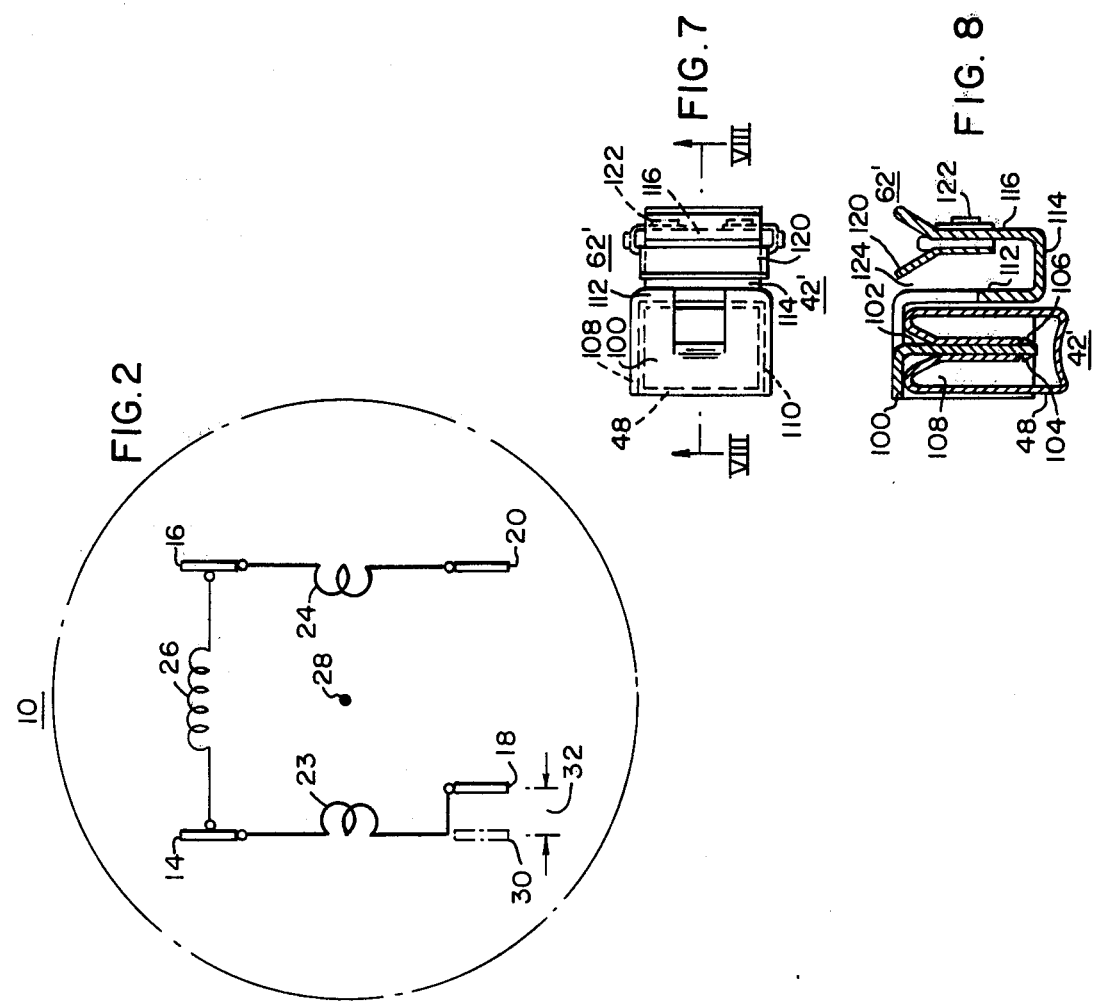

4,034,290

ELECTRICAL METER ASSEMBLY HAVING DISPLACED METER AND SOCKET TERMINALS

BACKGROUND OF THE INVENTION

1. Field of the Invention

The invention relates in general to electrical meters, and more specifically to watthour meters constructed to prevent unauthorized usage of electrical energy.

2. Description of the Prior Art

Theft of electricity has always been a problem, and the problem has been growing in magnitude due to the increasing cost of electrical energy. The theft of electrical energy may occur through the use of a stolen electric meter, reorienting a meter to either stop the register, or to cause it to run backwards, internal tampering of the meter to affect the registration of usage, and external wiring which by-passes the meter.

Various approaches have been used in the prior art to discourage the different types of electrical service theft. For example, new meter and meter socket combinations have been designed which permits only a special meter to be plugged into a specially designed meter socket, with the special meter being pluggable into the special socket with only one orientation. This approach prevents reorienting a meter to stop or reverse the register, and it reduces theft by swapping the original meter with a stolen meter between meter reading periods. The use of a new meter-meter socket combination, however, may economically be applied only to new installations because of the time and cost of removing a standard meter socket from an existing installation and rewiring the special meter socket in its place.

It would be desirable to be able to discourage meter swapping and/or reorienting of the meter, without the necessity of removing the standard meter socket from an existing installation and replacing it with a non-standard special socket.

SUMMARY OF THE INVENTION

Briefly, the present invention is a new and improved electric meter assembly which utilizes a special plug-in meter and a terminal adaptor for a standard meter socket. The special meter will not operate with a standard meter socket, but the proper terminal adaptor quickly converts a standard meter socket to permit it to only accept the special meter. Further, it permits the special meter to be plugged into the modified meter socket with only one orientation of the meter relative to the meter socket.

In the preferred embodiment of the invention, the special plug-in meter has an unsymmetrical terminal arrangement, wherein one of its blade terminals is laterally displaced from the usual location. An electrically conductive terminal adaptor is plugged into a predetermined jaw terminal of the standard meter socket. The adaptor is self-locking, preventing the removal of the adaptor once it has been plugged into the jaw terminal, it blocks access to the jaw terminal, and it includes an auxiliary jaw terminal for receiving the displaced blade terminal of the meter. Thus, a stolen standard meter will not plug into the modified meter socket due to the blocked jaw terminal, and the special meter will only plug into the modified meter socket with the proper orientation relative thereto. While this invention is particularly suitable for modifying existing meter installations, it may also be used on new meter installations by merely placing the adaptor on the proper meter socket terminal, before or after wiring the standard meter socket into position.

BRIEF DESCRIPTION OF THE DRAWINGS

The invention may be better understood, and further advantages and uses thereof more readily apparent, when considered in view of the following detailed description of exemplary embodiments, taken with the accompanying drawings in which:

FIG. 1 is a perspective view of a socket-type or plug-in electrical meter constructed according to the teachings of the invention;

FIG. 2 is a diagrammatic and schematic view of the meter terminals and the coils connected thereto, when viewing the meter shown in FIG. 1 from the front, in the direction of arrows II—II;

FIG. 3 is an elevational view of a standard meter socket with one of its jaw terminals modified with an adaptor, according to the teachings of the invention;

FIG. 4 is a schematic view of the meter socket shown in FIG. 3, indicating the connection of the line and load conductors to its jaw terminals; FIGS. 5 and 6 are elevational and sectional views, respectively, of a terminal adaptor which may be used to modify a jaw terminal of a standard meter socket; and FIGS. 7 and 8 are elevational and sectional views, respectively, of still another terminal adaptor which may be used to modify a jaw terminal of a standard meter socket.

DESCRIPTION OF PREFERRED EMBODIMENTS

Referring now to the drawings, and to FIGS. 1 and 2 in particular, there is shown a plug-in meter 10 constructed according to the teachings of the invention. FIG. 1 is a perspective view of the meter 10, and FIG. 2 is a diagrammatic view of the meter terminals shown in FIG. 1, along with a schematic representation of the various coils or windings connected thereto. The meter terminals shown in FIG. 2 are arranged as they would appear when viewing the meter 10 shown in FIG. 1 from the front thereof, i.e., in the direction of arrows II-II.

More specifically, meter 10 is an induction watthour integrating meter which is of the self-contained, detachable or socket-type utilized for billing electrical power supplied by an electrical utility to a customer load. The meter 10 includes a meter movement having an electromagnetic structure which drives an electroconductive disc and associated which drives a meter register. Since the meter movement may be conventional, it is not shown in detail. The coils or windings of the electromagnetic structure are shown schematically in FIG. 2, and will be hereinafter referred to.

The meter movement includes a frame which is carried on a first side of a base assembly 12 to provide a meter chassis assembly which includes four bayonet-type terminal blades 14, 16, 18 and 20, which extend in a sealed relationship through the base assembly 12 to project outwardly from the second side thereof. A cover 22, formed of glass or a suitable transparent plastic, cooperates with the base 12 to provide an enclosure for the meter movement.

As illustrated schematically in FIG. 2, a first electrical circuit is established from line terminal 14 to load terminal 18 via a current coil or winding 23, and a second electrical circuit is established from line terminal 16 to load terminal 20 via a current coil 24. A voltage winding 26 is connected between terminals 14 and 16.

In a conventional meter, the terminals are symmetrically arranged about a central axis or horizontal center line 28 of the meter, which center line is perpendicular to the base 12. Accordingly, the two upper line terminals 14 and 16 are equally spaced laterally from the center axis along the symmetrical terminal axes 29A and 29B. In conventional meters these axes extend vertically. In prior art meters, the two lower load terminals are aligned with the upper line terminals along the parallel axes 29A and 29B. This symmetrical arrangement permits a meter to be disoriented by 180°, and still establish electrical circuits from the electrical utility lines to the customer's load. If the meter is not equipped with a special unidirectional register, the disorientation will either stop the register, or it will cause it to run backwards, depending upon the register type. According to the teachings of the invention, three of the terminals are placed in the conventional locations, while the remaining terminal is displaced laterally from the usual location to provide an unsymmetrical arrangement of the terminals about center line 28.

The terminal of meter 10 which is displaced is preferably a lower terminal, such as terminal 18, as the lower terminals are connected to jaw terminals on the load side of the meter socket, which terminals are "dead" when the meter is removed from the socket. As illustrated most clearly in FIG. 2, terminal 18 is displaced from its usual position, shown in phantom at 30, by a suitable dimension indicated at 32. The value of dimension 32, and the direction of the displacement relative to the usual terminal location on the axis 29B in FIG. 1, will depend upon the specific terminal adaptor used to modify a terminal of the meter socket. The illustrated horizontal displacement of terminal 18 towards terminal 20 is convenient from the standpoint of available space in the meter socket.

FIGS. 3 and 4 illustrate a meter socket 40, modified with an adaptor 42, according to the teachings of the invention. FIG. 3 is an elevational view of meter socket 40, and FIG. 4 is a diagrammatic and schematic view of the socket 40, when viewing the socket 40 from the same side thereof as the FIG. 3 view.

More specifically, socket 40 includes a plurality of jaw terminals 44, 46, 48 and 50 symmetrically arranged about a horizontal center line 52 within an open ended enclosure 54. The symmetrical arrangement of the jaw terminals 44, 46, 48 and 50 is the usual arrangement for receiving the blade contact terminals of the usual watthour meter. The symmetrical terminal axes 55A and 55B are vertically parallel and equally spaced laterally from the axis 52 by the symmetrical horizontal axes 55C and 55D. The terminals 44 and 48 are on the common axis 55A and the terminals 46 and 50 are on the common axis 55B with the axes 55A and 55B being coaligned with the meter axes 29B and 29A, respectively, when the meter 10 is positioned for mounting in the socket enclosure 54. As illustrated schematically in FIG. 4, line jaw terminals 44 and 46 are connected to the electrical power line conductors, via suitable connectors, such as to line conductors 56 and 57, respectively, and load jaw terminals 48 and 50 are connected to load conductors 58 and 59, respectively, via suitable connectors. While a single phase three-wire system is illustrated in the FIGURES, it is to be understood that a single phase two-wire system may also be used.

The symmetrical arrangement of jaw terminals 44, 46, 48 and 50 is modified to provide the same unsymmetrical arrangement as the blade terminals of meter 10, via the adaptor 42. Adaptor 42 is an electrically conductive member, which may be formed out of the same material as the jaw terminals, such as a high quality resilient copper alloy, either bronze or beryllium. Adaptor 42 includes a first portion 60 which plugs into the conventional jaw terminal in a self-locking manner, which portion also blocks access to the modified jaw terminal. As illustrated in the FIGURES, with terminal 18 of the meter 10 displaced from the usual location, jaw terminal 48 of the socket 40 would be the terminal which would be modified by the adaptor 42.

Adaptor 42 includes a second portion 62 which functions as an auxiliary jaw terminal. The auxiliary jaw terminal 62 is displaced from the center line of jaw terminal 48 by the dimension 64, which dimension is the same as the dimension 32 shown in FIGS. 1 and 2.

Jaw terminal 48 is a load terminal, being connected to load conductor 58, and as such it will be "dead" when a meter is not plugged into the socket. Thus, adaptor 42 may be quickly and easily snapped into the jaw 48 at the time the special meter 10 is to be installed. Once adaptor 42 is positioned over jaw terminal 48, the meter socket 54 will only accept the special meter 10, and it will accept special meter 10 only in the proper orientation thereof relative to the socket. A standard meter will not fit the modified socket in any orientation because jaw terminal 48 is blocked from receiving a blade terminal. Further, meter 10 cannot be disoriented 180° and mounted in the socket 40, as jaw terminal 48 is blocked.

FIG. 5 is an elevational view of adaptor 42 shown in position over jaw terminal 48, with adaptor 42 being constructed according to an embodiment of the invention. FIG. 6 is a sectional view of adaptor 42 and terminal 48, taken between arrows VI—VI. Portion 60 of adaptor 42 includes an outer U-shaped member 69 having first and second spaced leg portions 70 and 72, a connecting bight 74, and a portion 76 which depends from the inner surface of bight 74. Portion 76 enters the opening in jaw terminal 48, and once in the proper position within the jaw terminal 48 it locks itself, preventing removal thereof. The locking means associated with the depending portion 76 includes locking tabs 80 and 82, best shown in FIG. 6, which are located at the extreme outer ends of portion 76, with these ends flaring in opposite directions away from a center line of the terminal 48 to provide the locking tabs. Any attempt to pull the adaptor 42 from the jaw terminal 48 is defeated by the tabs 80 and 82 which catch on the finger-like resilient portions of the jaw terminal which are spread apart by the locking tabs as portion 76 is forced into the jaw terminal, and then the finger-like members snap back as the tabs 80 and 82 clear the ends of the jaw fingers.

The depending portion 76 also includes side guards 84 and 86 at one open end of the U-shaped member 69, and side guards 88 and 90 at the other open end, which prevent the fingers of jaw terminal 48 from being manually spread apart to clear the locking tabs 80 and 82. As illustrated in FIG. 5, the side guards may be integral, flared portions of the depending portion 76.

The second portion 62 of the adapter 42, which functions as the auxiliary jaw terminal, may be constructed similar to the jaw terminal 48 and brazed or otherwise mechanically and electrically connected to leg portion 72 of the U-shaped member 69.

FIG. 7 is an elevational view of an adaptor 42', disposed over terminal 48, which adaptor is constructed according to another embodiment of the invention. A first portion 60' of adaptor 42' includes a top portion 100 which has a depending portion 102 for insertion into the fingers of the jaw terminal 48, with the lower end of portion 102 having locking tabs 104 and 106 thereon which prevent the adaptor 42' from being removed once it is snapped into position in the jaw terminal. Opposite ends of the top portion 100 include side portions 108 and 110 which function as side guards to close the open ends of terminal 48 and prevent manual spreading of the jaw fingers to clear the locking tabs 104 and 106. The top portion 100 may also include a first leg portion 112 integral therewith which is of sufficient length to be bent into a configuration which includes a bight 114 and a second leg portion 116. A spring-like resilient metallic member 120 is attached to the second leg portion 116 by suitable hardware 122, with the spring-like member 120 being spaced from the leg portion 112 to define an opening 124 for receiving the blade terminal 18 of the meter 10.

In summary, there has been disclosed a new and improved meter assembly which discourages theft of electrical energy by modifying a standard meter socket to accept a special meter having unsymmetrically arranged blade terminals. A stolen electrical meter will not fit the modified standard socket in any orientation, and the special meter will fit the modified socket in only the proper orientation.

I claim as my invention:

1. An electric meter assembly, comprising:
    a meter socket including plural line and load terminals disposed on symmetrical terminal axes thereof such that said load terminals are aligned with said line terminals along common symmetrical axes which are parallel;
    a meter including plural terminals for plug-in attachment to said meter socket terminals, said meter terminals being disposed relative to symmetrical terminal axes thereof such that one of the meter terminals is offset from one of the meter terminal axes, and said meter terminal axes being alignable with the socket terminal axes so that the one meter terminal is offset from one of the socket terminals when said meter is positioned for mounting in said meter socket; and
    an electrically conductive terminal adaptor including a first portion attachable to said one socket terminal wherein said first portion has a blocking part for preventing insertion of a meter terminal into said one socket terminal, and said adaptor further including a second portion defining an auxiliary socket terminal being offset from said one socket terminal so that said one socket terminal is modified for mounting said meter in said meter socket in only one predetermined orientation.

2. The electric meter assembly of claim 1 wherein the one modified terminal of the meter socket is a load terminal.

3. The electric meter assembly of claim 1 wherein the terminals of the meter are unsymmetrically arranged with the offset terminal being laterally displaced from the one terminal axis, and the adaptor includes the auxiliary terminal displaced laterally from the one modified terminal to duplicate the unsymmetrical arrangement of the terminals of the meter.

4. The electric meter assembly of claim 1 wherein the one modified terminal is a jaw terminal, and the adaptor further includes a self-locking portion insertable into the jaw terminal, said self-locking portion cooperating with the jaw terminal to prevent removal of the adaptor from the jaw terminal.

5. The electric meter assembly of claim 4 wherein the self-locking portion includes locking tabs which prevent removal of the adaptor by axial force.

6. The electric meter assembly of claim 5 wherein the adapter includes side guards which block access to the locking tabs.

* * * * *